(12) United States Patent
True et al.

(10) Patent No.: US 12,320,837 B2
(45) Date of Patent: Jun. 3, 2025

(54) METHOD AND SYSTEM FOR BRANCH CIRCUIT MARKING

(71) Applicant: Simplewire ApS, Kobenhavn K (DK)

(72) Inventors: Dennis True, Kobenhavn N (DK);
Martin Raymond Jensen, Valby (DK);
Peter Svendsen-Tune, Kobenhavn V (DK)

(73) Assignee: Simplewire ApS, København K (DK)

( * ) Notice: Subject to any disclaimer, the term of this patent is extended or adjusted under 35 U.S.C. 154(b) by 207 days.

(21) Appl. No.: 18/253,118

(22) PCT Filed: Nov. 15, 2021

(86) PCT No.: PCT/EP2021/081645
§ 371 (c)(1),
(2) Date: May 16, 2023

(87) PCT Pub. No.: WO2022/106340
PCT Pub. Date: May 27, 2022

(65) Prior Publication Data
US 2024/0036099 A1    Feb. 1, 2024

(30) Foreign Application Priority Data

Nov. 19, 2020  (EP) .................................... 20208738

(51) Int. Cl.
*G01R 31/20*     (2006.01)
(52) U.S. Cl.
CPC .................................. *G01R 31/20* (2013.01)
(58) Field of Classification Search
None
See application file for complete search history.

(56) References Cited

U.S. PATENT DOCUMENTS

| 4,734,638 A | 3/1988 | Weber |
| 5,422,564 A | 6/1995 | Earle et al. |
| | (Continued) | |

FOREIGN PATENT DOCUMENTS

| CN | 204144183 U | 2/2015 |
| CN | 206420986 U | 8/2017 |
| | (Continued) | |

OTHER PUBLICATIONS

International Search Report and Written Opinion issued in related App. No. PCT/EP2021/081645, mailed Feb. 14, 2022.
(Continued)

*Primary Examiner* — Jermele M Hollington
(74) *Attorney, Agent, or Firm* — AVEK IP, LLC

(57) ABSTRACT

A method of electronically marking a plurality of branch circuits of an electrical installation of an engineering structure, the plurality of branch circuits comprising a first branch circuit and a second branch circuit, includes: providing one or more signalling devices, wherein at least one of the signalling devices is communicatively coupled to the first branch circuit, and wherein at least one of the signalling devices is communicatively coupled to the second branch circuit; providing, by the at least one signalling device communicatively coupled to the first branch circuit, a first identification signal on the first branch circuit; and providing, by the at least one signalling device communicatively coupled to the second branch circuit, a second identification signal on the second branch circuit, wherein the second identification signal is different from the first identification signal.

20 Claims, 2 Drawing Sheets

(56) References Cited

U.S. PATENT DOCUMENTS

| | | | |
|---|---|---|---|
| 6,154,032 | A | 11/2000 | Coia et al. |
| 6,222,358 | B1 | 4/2001 | Wottrich |
| 6,933,712 | B2 | 8/2005 | Miller et al. |
| 8,111,163 | B2 | 2/2012 | Utaka et al. |
| 8,599,523 | B1 * | 12/2013 | Ostrovsky ............... H02H 3/16 361/45 |
| 9,147,545 | B2 | 9/2015 | Broghammer |
| 10,536,039 | B2 | 1/2020 | Haartsen et al. |
| 10,727,660 | B1 | 7/2020 | Chen et al. |
| 2004/0000898 | A1 * | 1/2004 | Pool ....................... G01R 31/60 324/66 |
| 2009/0287429 | A1 | 11/2009 | Calcaterra et al. |
| 2012/0050062 | A1 | 3/2012 | Archibald et al. |
| 2014/0001846 | A1 | 1/2014 | Mosebrook et al. |
| 2015/0185259 | A1 * | 7/2015 | Axelsson ............. G01R 21/133 324/140 R |
| 2018/0031396 | A1 | 2/2018 | Bohlin et al. |
| 2019/0180159 | A1 | 6/2019 | Schmidt |
| 2021/0272425 | A1 | 9/2021 | Sträng et al. |

FOREIGN PATENT DOCUMENTS

| | | |
|---|---|---|
| CN | 206742961 U | 12/2017 |
| CN | 207910254 U | 9/2018 |
| CN | 208580987 U | 3/2019 |
| DE | 102007025494 A1 | 12/2008 |
| DE | 202010004052 U1 | 9/2010 |
| DE | 102016122157 | 5/2018 |
| EP | 2290384 A2 | 3/2011 |
| EP | 3308968 A1 | 4/2018 |
| EP | 3309771 A1 | 4/2018 |
| GB | 2215095 A | 9/1989 |
| WO | 9961928 A1 | 12/1999 |
| WO | 0026679 A1 | 5/2000 |
| WO | 2011035436 A1 | 3/2011 |
| WO | 2019108507 A1 | 6/2019 |

OTHER PUBLICATIONS

Extended European Search Report dated Apr. 19, 2020, issued in EP Application No. 20208738.3, 9 pages.

* cited by examiner

METHOD AND SYSTEM FOR BRANCH CIRCUIT MARKING

CROSS-REFERENCE TO RELATED APPLICATIONS

This application is the national stage of, and claims priority to, International Application No. PCT/EP2021/081645 filed Nov. 15, 2021, which claims priority to European Application No. 20208738.3, filed Nov. 19, 2020, the disclosure of each of which is incorporated by reference herein in its entirety.

FIELD OF THE INVENTION

The disclosure relates to marking of a branch circuit of a circuit breaker.

BACKGROUND

Electrical installations in structures, such as buildings, construction sites, ships, or the like, are typically routed to an electrical panel having a number of circuit breakers. Each of these circuit breakers are often connected to a number of electrical outlets and/or electrical apparatuses, thereby connecting the outlets/apparatuses to a power supply signal, such as a grid voltage, via one of the circuit breakers. The wiring from the circuit breaker to the electrical outlets and/or electrical apparatuses is often referred to as a branch circuit.

When an electrical fault, such as a shortage, occurs on a branch circuit and/or an apparatus connected to the branch circuit, the circuit breaker will interrupt the power supply signal only to the branch circuit, while power supply signal may remain on other branch circuits, i.e. branch circuits of other circuit breakers.

Typically, each of the branch circuits of an electrical installation are marked, e.g. by means of labels on the electrical panel and corresponding labels on the outlets. The marks are typically provided to aid in identifying which branch circuit an outlet and/or an electrical apparatus is connected to, so as to facilitate maintenance of the branch circuit and/or the electrical installation. For instance, when a socket outlet of a branch circuit needs to be replaced or installed, the circuit breaker of the branch circuit should be interrupted, or flipped, manually to interrupt the power supply signal while the outlet is installed. Such marking is typically provided on each outlet of a branch circuit and a circuit breaker of the branch circuit.

Often, however, the marking of the branch circuits is performed manually by an electrically qualified person, such as an electrician, upon installation of the electrical installation. There is, however, a risk that a branch circuit may be erroneously labelled, again leading to a risk of personnel injuries, e.g. where an unintended branch circuit is disconnected the circuit breaker instead of an intended. Furthermore, there is a risk that the label may fall off, and/or that the label may be worn down, in turn making identification of the branch circuit difficult.

Moreover, it remains a problem, when positioned at an outlet or electrical apparatus, to determine to which branch circuit the outlet/apparatus is connected.

It, therefore, remains a problem to provide a marking of a branch circuit of a circuit breaker, which mitigates at least some of the abovementioned problems.

SUMMARY

A first aspect of this disclosure relates to a method of electronically marking a plurality of branch circuits of an electrical installation of an engineering structure, the plurality of branch circuits comprising a first branch circuit and a second branch circuit. The method comprises providing one or more signalling devices, wherein at least one of the signalling devices is communicatively coupled to the first branch circuit, and wherein at least one of the signalling devices is communicatively coupled to the second branch circuit. The method further comprises providing, by the at least one signalling device communicatively coupled to the first branch circuit, a first identification signal on the first branch circuit; and providing, by the at least one signalling device communicatively coupled to the second branch circuit, a second identification signal on the second branch circuit, wherein the second identification signal is different from the first identification signal.

Thereby, a stable identification of each of the branch circuits may be achieved, as different signals are transmitted onto each of the first and second circuits. For instance, where the first and/or second identification signals are transmitted continuously or periodically, it may be possible to identify the branch circuit of any outlet by means of the identification signals, which again may remove the need for any further marking of outlets and/or branch circuits.

As the first and second identification signals are present in the first and second branch circuit, respectively, the branch circuit may moreover be identified anywhere in the circuit, such as at an outlet and/or an apparatus connected to the branch circuit, thereby allowing for an easy identification of the branch circuits and their outlets.

An engineering structure may be any construction, in which electrical wiring is installed or to be installed, such as a building, such as a residential and/or an office building, a ship, a vessel, an offshore construction, a construction site, mines, or the like.

The steps of the method may be performed in any order, such as providing the one or more signalling devices, providing the first identification signal and then providing the second identification signals, or providing the one or more signalling devices, providing the second identification signal and then providing the first identification signals.

The first and second identification signals may be provided simultaneously. Alternatively, the first and second identification signals may be provided periodically, potentially time-delayed relative to each other.

The first and second identification signals may be signals of a frequency higher than a power supply signal, such as a grid voltage, a mains voltage, a grid voltage or any alternating current (AC) power supply signal, and/or a first, a second, a third, and/or a fourth harmonic thereof.

The first and/or second identification signals may be a digital signal. The first and/or second identification signals may have a voltage amplitude lower than a supply voltage. Potentially, the first and/or second identification signals may have a voltage amplitude peak-peak of less than 20 V, such as less than 10 V, such as 5 V, 3.3 V, or 1.8 V.

The first and/or second identification signals may be signals representative of an identification mark, such as a text string, a number, a hexadecimal number, or the like. The identification signals and/or the identification marks may be unique and/or may be unique in the electrical installation.

In some embodiments, an identification mark may be determined by a user. The one or more signalling devices may generate the respective identification signal based on an identification mark input by the user. The one or more signalling devices may comprise an input interface allowing the user to input an identification mark. The input interface may comprise a wireless communication interface allowing a user to enter the mark via a user device, e.g. a mobile phone, a tablet, a computer, or the like, and/or one or more physical buttons. In some embodiments, the identification marks are based on and/or comprises a hardware ID of the one or more signalling devices.

The first branch circuit may be a circuit of a first circuit breaker. A first branch circuit may thus be the circuit, which can be supplied with a power supply signal, i.e. a line voltage, a grid voltage, a mains voltage, or the like, via the first circuit breaker The second branch circuit may be a circuit of a second circuit breaker. A second branch circuit may thus be the circuit, which can be supplied with a power supply signal, i.e. a line voltage, a grid voltage, a mains voltage, or the like, via the second circuit breaker.

The one or more signalling devices may be configured to be communicatively coupled to a respective circuit breaker. In some embodiments, the one or more signalling devices may be arranged in between one or more circuit breakers and respective branch circuit(s) thereof, potentially when seen along a signal path of a power supply signal.

The one or more signalling devices may be configured to be installed in an electrical panel and/or on a rail. Additionally or alternatively, the one or more signalling devices may comprise a bracket and/or an attachment element for fixing the signalling device to a rail, such as a rail, potentially according to a Deutsches Institut für Normung (DIN) standard.

In some embodiments, the one or more signalling devices may be configured to be connected, such as directly connected, to an output terminal of a circuit breaker and/or to be physically connected to the circuit breaker, such as the output terminal of the circuit breaker. By direct connection is here to be understood a connection between the two elements by a point to point conduction by a single electrical conductor, such as a wire, or by physical connection of electrically conducting portions of the two elements.

The one or more signalling devices may comprise a signal generator configured to generate the first and/or the second identification signal. The one or more signalling devices may moreover comprise a processing unit, potentially connected to a signal generator configured to generate the first and/or second identification signal. The processing unit may be central processing unit, CPU, a micro controller unit, MCU, a field-programmable gate array (FPGA), a field-programmable logic array (FPLA) or the like. In some embodiments, the one or more signalling devices may comprise a wireless communication interface for communication with a user device. A wireless communication interface may, for instance, use Radio Frequency Identification (RFID), Near Field Communication (NFC), a 2.4 GHz and/or 5 GHz communication interface, such as a Wi-Fi module, a Bluetooth® module, a ZigBee module, a Z-Wave module or the like.

The one or more signalling devices may be connected to a power supply unit, providing a supply voltage to the one or more signalling devices. The power supply unit may, for instance, provide a low-voltage supply voltage to the one or more signalling devices, potentially having an amplitude of less than 30 V AC (RMS) or DC, such as a 24V, a 18V, a 15V, a 12V, a 9V, a 5V, or a 3.3V AC or DC supply voltage. Alternatively or additionally, the one or more signalling devices may be provided with a battery for supplying power to the one or more signalling devices.

In some embodiments, the one or more signalling devices comprise a display unit for displaying an identification mark of the first and/or the second branch circuit. The display may allow for an easy identification of the branch circuit and/or for an easy identification of the circuit breaker of the branch circuit, e.g. where the one or more signalling devices are installed near a circuit breaker, such as in an electrical panel. For instance, if the one or more signalling devices are installed in an electrical panel, a display may indicate a branch circuit identification mark, which can be identified at an outlet and/or apparatus. The circuit breaker corresponding to the branch circuit of this outlet and/or apparatus may then be easily identified as the circuit breaker, which is communicatively coupled in the electrical panel to the one or more signalling device.

The one or more signalling devices may further comprise a filter, such as a low-pass filter, communicatively connected to the at least one input terminal and the first and/or second connection interface, the filter being configured to attenuate a frequency of the first and/or second identification signal.

Thereby, where multiple branch circuits are connected to the same phase or hot lead, a transmission of an identification signal from one branch circuit may be pre-vented, in turn allowing for an improved marking and/or identification of the branch circuit(s).

The filter may be configured to attenuate and/or prevent the first and/or the second identification signal from reaching a circuit breaker of the respective branch circuits.

The filter may be configured to attenuate the first and/or second identification signal by at least 20 dB, at least 40 dB, at least 60 dB, at least 80 dB, or at least 100 dB. The filter may, additionally or alternatively, be configured not to attenuate the power supply signal, to attenuate the power supply signal less than 0.1 dB, 0.5 dB, or 1 dB. The filter may have a crossover frequency above a frequency of power supply signal, such as above 50 Hz, or above 60 Hz. Potentially, the filter has a crossover frequency at or above a frequency of a $1^{st}$, $2^{nd}$, $3^{rd}$, $4^{th}$, or $5^{th}$ harmonic of the power supply signal.

In some embodiments, the one or more signalling devices may be configured to provide the first and/or second signal via one or more relaying devices for relaying an identification signal onto the first and/or second branch circuit. The one or more signalling devices may be connected to one or more relaying devices, each of the one or more relaying devices potentially being configured to relay a respective signal, such as the first and/or second signal, onto the branch circuit.

In some embodiments, a signalling device is provided, the signalling device being configured to provide the first identification signal to the first branch circuit via a first relaying device, the signalling device being configured to provide a second identification signal to the second branch circuit via the second relaying device.

The one or more signalling devices may be arranged between a first circuit breaker and wiring of a first branch circuit, when seen along a signal path of a power supply signal. The one or more signalling devices may be arranged between a second circuit breaker and wiring of a second branch circuit, when seen along a signal path of a power supply signal.

In some embodiments, the one or more signalling devices is/are configured to be arranged in between a circuit breaker of a first branch circuit and a wiring of the first branch circuit, such as an or any outlet of the first branch circuit, when seen along a signal path of a power supply signal. The one or more signalling devices may alternatively or additionally be configured to be arranged in between a circuit breaker of a second branch circuit and a wiring of the second branch circuit, such as an or any outlet of the second branch circuit, when seen along a signal path of a power supply signal. Alternatively or additionally, the one or more signalling devices may be configured to be arranged in a signal path between a circuit breaker of a respective branch circuit and a wiring of the respective branch circuit, such as an outlet thereof, wherein the signal path is a signal path of a power supply signal.

In some embodiments, a first signalling device is configured to be arranged in the signal path between a circuit breaker of a first branch circuit and a wiring of the first branch circuit, such as an or any outlet of the first branch circuit, and a second signalling device is configured to be arranged in the signal path between a circuit breaker of a second branch circuit and a wiring of the second branch circuit, such as an or any outlet of the second branch circuit.

As an example, a position along the signal path between a circuit breaker and a wiring of a branch circuit may be downstream, such as directly downstream or directly after a circuit breaker, of the circuit breaker.

In some embodiments, the one or more signalling devices comprise one or more filters, such as one or more low-pass filters. For instance, the one or more signalling devices may each comprise a filter, such as a low-pass filter. The filter(s) may be configured to attenuate a frequency of the first and/or second identification signal. Alternatively or additionally, the filter(s) may be arranged to attenuate an identification signal passing through a circuit breaker, potentially so that the identification signal is attenuated when passing through the circuit breaker. The one or more filters may be configured to be arranged in a signal path between a circuit breaker of a first branch circuit and the one or more signalling devices and/or in a signal path between a circuit breaker of a second branch circuit and one or more signalling device. For instance, the one or more filters may be configured to be arranged in the signal path between the circuit breaker of the first branch circuit and a signal generator and/or a signal transmitter for transmitting the identification signal(s) of the one or more signalling devices.

In an embodiment, the one or more signalling devices comprise a first connection interface communicatively coupled to the first branch circuit and a second connection interface communicatively coupled to the second branch circuit.

Thereby, an easy installation of the one or more signalling devices may be provided, as the one or more signalling devices may be fixedly installed, e.g. in the electrical panel and/or adjacent to a circuit breaker of the respective branch circuit(s), and communicatively coupled to the branch circuits.

The one or more signalling devices may transmit the first and second identification to the first and second branch circuits simultaneously, time-offset, or time-multiplexed.

The first identification signal may be provided on the first branch circuit via the first connection interface and the second identification signal may be provided on the second branch circuit via the second connection interface.

The first and/or second connection interface may be a connection interface configured to provide a signal on a branch circuit, such as a wire of the branch circuit. A connection interface may be any electrically conducting interface configured to facilitate an electrical connection between the one or more signalling device and the wiring of the branch circuit(s). The first and/or second connection interface may be configured to provide a respective signal by means of induction, such as electromagnetic induction, and/or by means of electrical conduction through a wire. The first and/or second connection interfaces may be configured to introduce the respective signal in a wired and/or wireless manner. The first and/or second connection interface may be configured to provide the signal without intersecting and interrupting a signal path of the respective branch circuit. Alternatively or additionally, the first and/or second connection interface may configured to be arranged in a signal path of the respective branch circuit.

The first and/or second connection interface may comprise an inductor for inducing a signal onto the respective branch circuit, such as a wire thereof. The inductor may surround or substantially surround a wire of the respective branch circuit. Potentially, no wires will need to be cut when installing and/or removing the one or more signalling devices. Alternatively or additionally, the first and/or second connection interfaces may comprise a connection terminal. The first and second connection interfaces may comprise or be a first and second connection terminal, respectively. A first and/or second connection terminal may be any electrically conducting interface configured to facilitating a wired electrical connection between the one or more signalling device and the wiring of the branch circuit(s). The connection terminal may, for instance, be screw-in terminals and/or may be spring-loaded connection terminals.

Where one or more relaying devices are provided, each of the relaying devices may comprise a connection interface as described herein with respect to the one or more signalling devices.

In some embodiments, the connection interfaces are identical or substantially identical to connection terminals of a circuit breaker, potentially a circuit breaker of the first and/or second branch circuit.

In some embodiments, the method further comprises routing, via the one or more signalling devices, a power supply signal on the first branch circuit; and routing, via the one or more signalling devices, a power supply signal on the second branch circuit.

Thereby, the branch circuit may be connected to the circuit breaker via the one or more signalling devices, in turn allowing for an easier wiring and/or installation of the one or more devices.

A power supply signal is throughout this text to be understood as a net voltage, a grid voltage and/or a mains voltage, such as an AC voltage of 400 VAC, 230 VAC, 220 VAC, 120 VAC, 110 VAC, a DC voltage, or the like. The power supply signal may comprise one AC phase, two AC phases, or three AC phases.

The one or more signalling devices may be configured to transmit the first and/or second identification signal while the power supply signal is routed through the one or more signalling devices. This, in turn, allows for a flexible identification of the branch circuit, as it may be marked and identified while power is supplied to the outlets and/or apparatuses connected to the branch circuit.

In an embodiment, the method further comprises receiving, by a signal receiving device, an identification signal, the identification signal being the first identification signal or the second identification signal. In some embodiments, the method further comprises identifying, by the signal receiving device, a branch circuit based on the identification signal.

Thereby an easy identification of the marked first and/or second branch circuit may be provided, potentially at any outlet and/or apparatus thereof.

The branch circuit may be the first branch circuit or the second branch circuit.

In some embodiments, the signal receiving device may be configured to receive the signal from the respective branch circuit either wirelessly and/or by wired connection, such as connecting a wire, a probe, a pin, a pad, or the like, of the signal receiving device to a wire of the respective branch circuit.

The first and/or second identification signal may be signals configured to be transmitted via a wiring of the first and/or second branch circuit, respectively, and received wirelessly by the receiving device by using the wiring as antenna. The first and/or second identification signal may be a NFC or RFID signal configured to be transmitted via a wiring of the first and/or second branch circuit, respectively.

The signal receiving device may be configured to wirelessly receive the first and/or second identification signal when in proximity, such as less than 50 cm, less than 30 cm, less than 20 cm, less than 15 cm, or less than 10 cm, from a wire or an outlet of the respective branch circuit.

The signal receiving device may comprise a signal receiver configured to receive the first and/or second identification signal. The signal receiving device may comprise a processing unit, such as a CPU, a MCU, a FPGA, or a FPLA, for identifying the identification signal. The signal receiving device may, in some embodiments, be a cellular phone, a tablet, a personal computer, or the like.

In an embodiment, the one or more signalling devices comprises a first signalling device and a second signalling device, wherein the first branch circuit is communicatively coupled to the first signalling device, and wherein the second branch circuit is communicatively coupled to the second signalling device, wherein the first identification signal is provided by the first signalling device, and wherein the second identification signal is provided by the second signalling device.

Thereby, the first signalling device and the second signalling device may each be configured to generate one signal, in turn allowing for an, at least in production or in installation, less complex device. Moreover, the first and second signalling devices may be fixedly installed, e.g. in an electrical panel, and connected to the first and second branch circuit, respectively, allowing for a more stable identification signalling on the branch circuits.

The first signalling device may be pre-configured, such as during production, to provide the first identification signal. The second signalling device may be pre-configured, such as during production, to provide the second identification signal.

In some embodiments, the method further comprises the steps of: providing, by the first signalling device, a first identifier of the first branch circuit; and providing, by the second signalling device, a second identifier of the second branch circuit, the second identifier being different from the first identifier.

In some embodiments, each of the first signalling device and the second signalling device comprise an input terminal and a connection terminal, wherein the input terminal of the first signal signalling device is communicatively coupled to a first circuit breaker and the connection terminal of the first signalling device is communicatively coupled to the first branch circuit; and wherein the input terminal of the second signal signalling device is communicatively coupled to a second circuit breaker and the connection terminal of the second signalling device is communicatively coupled to the second branch circuit.

Thereby, the first and second devices may be easily connected to first and second circuit breakers, respectively, as well as to the first and second branch circuits, respectively.

The input terminal may comprise one or more connection points. The one or more connection points may be configured to be connected to a power supply signal, such as a hot wire, a phase, and/or a neutral conductor. The input terminal may be configured to mechanically connect to and/or engage with a terminal of the respective circuit breaker.

In an embodiment, the first identification signal comprises a pulse-width modulated (PWM) signal and/or a radio frequency identification (RFID) signal. The second identification signal may comprise a PWM signal and/or a RFID signal.

Where the first and/or second identification signal is a RFID signal, wiring of the first and/or second branch circuit may be used as or act as an antenna for the signal, potentially so that it the identification signal may be read by a reading device within a predetermined distance from a wire or an outlet of the branch circuit. The identification signal may comprise an identification mark.

Alternatively or additionally, the first and/or second identification signal may comprise a sine signal. Potentially, the first identification signal comprises a sine signal having a first frequency and the second identification signal having a second frequency. Additionally or alternatively, the frequency of the sine signal may be indicative of and/or be an identification mark of the respective branch circuit. The frequency of a sine signal of the first and/or second identification signal may be higher than a power supply signal and/or one or more of a $1^{st}$-$5^{th}$ harmonic thereof.

In some embodiments, the first and/or second identification signal may be encrypted and/or coded.

A second aspect of the disclosure relates to a system for electronically marking a plurality of branch circuits of an electrical installation of an engineering structure, the plurality of branch circuits comprising a first branch circuit and a second branch circuit. The system comprises: one or more signalling devices comprising a first connection interface and a second connection interface. The first connection interface of the one or more signalling devices is communicatively couplable to the first branch circuit and the second connection interface is communicatively couplable to the second branch circuit. The one or more signalling devices are configured to provide a first identification signal on the first branch circuit and configured to provide a second identification signal on a second branch circuit. The second identification signal is different from the first identification signal.

Thereby an easy and stable identification of a branch circuit and the outlets and/or apparatuses of the branch circuit may be provided, as the first and/or second identification signal may be present throughout the branch circuit.

The system for electronically marking a plurality of branch circuits may provide identical or similar advantages to the method according to the first aspect of the invention. Embodiments of the system, the one or more signalling devices, and/or the steps, which the one or more signalling devices of the system is configured to perform, may be the same as described with respect to the method according to the first aspect of the invention.

The first identification signal may be provided on the first branch circuit via the first connection interface and the second identification signal may be provided on the second branch circuit via the second connection interface.

In an embodiment, the one or more signalling devices further comprise at least one input terminal for receiving a power supply signal and are further configured to route a power supply signal to the first branch circuit and/or to the second branch circuit.

In some embodiments, the one or more signalling devices further comprise a filter, such as a low-pass filter, communicatively connected to the at least one input terminal, the filter being configured to attenuate a frequency of the first and/or second identification signal.

In an embodiment, the system further comprises a signal receiving device configured to receive an identification signal, the identification signal being the first identification signal or the second identification signal, the signal receiving device further being configured to identify a branch circuit based on the identification signal.

In an embodiment, the one or more signalling devices comprises a first signalling device and a second signalling device, wherein the first branch circuit is communicatively couplable to the first signalling device, and wherein the second branch circuit is communicatively couplable to the second signalling device.

In some embodiments, the first signalling device comprises an input terminal configured to be connected to a first circuit breaker and an output interface configured to be connected to the first branch circuit, and the second signalling device comprises an input terminal configured to be connected to a second circuit breaker and an output interface configured to be connected to the second branch circuit.

In an embodiment, the first identification signal comprises a pulse-width modulated (PWM) signal and/or a radio frequency identification (RFID) signal, and wherein the second identification signal comprises a PWM signal and/or a RFID signal.

The different aspects of the invention can be implemented in different ways including as a method of electronically marking a plurality of branch circuits of an electrical installation of an engineering structure a system, and system for electronically marking a plurality of branch circuits of an electrical installation of an engineering structure as described above and in the following, each yielding one or more of the benefits and advantages described in connection with at least one of the aspects described above, and each having one or more preferred embodiments corresponding to the preferred embodiments described in connection with at least one of the aspects described above and/or disclosed in the dependent claims. Furthermore, it will be appreciated that embodiments described in connection with one of the aspects described herein may equally be applied to the other aspects.

BRIEF DESCRIPTION OF THE DRAWINGS

The above and/or additional objects, features and advantages of the invention, will be further elucidated by the following illustrative and non-limiting detailed description of embodiments of the invention, with reference to the appended drawings, wherein.

DETAILED DESCRIPTION

Figure 1:
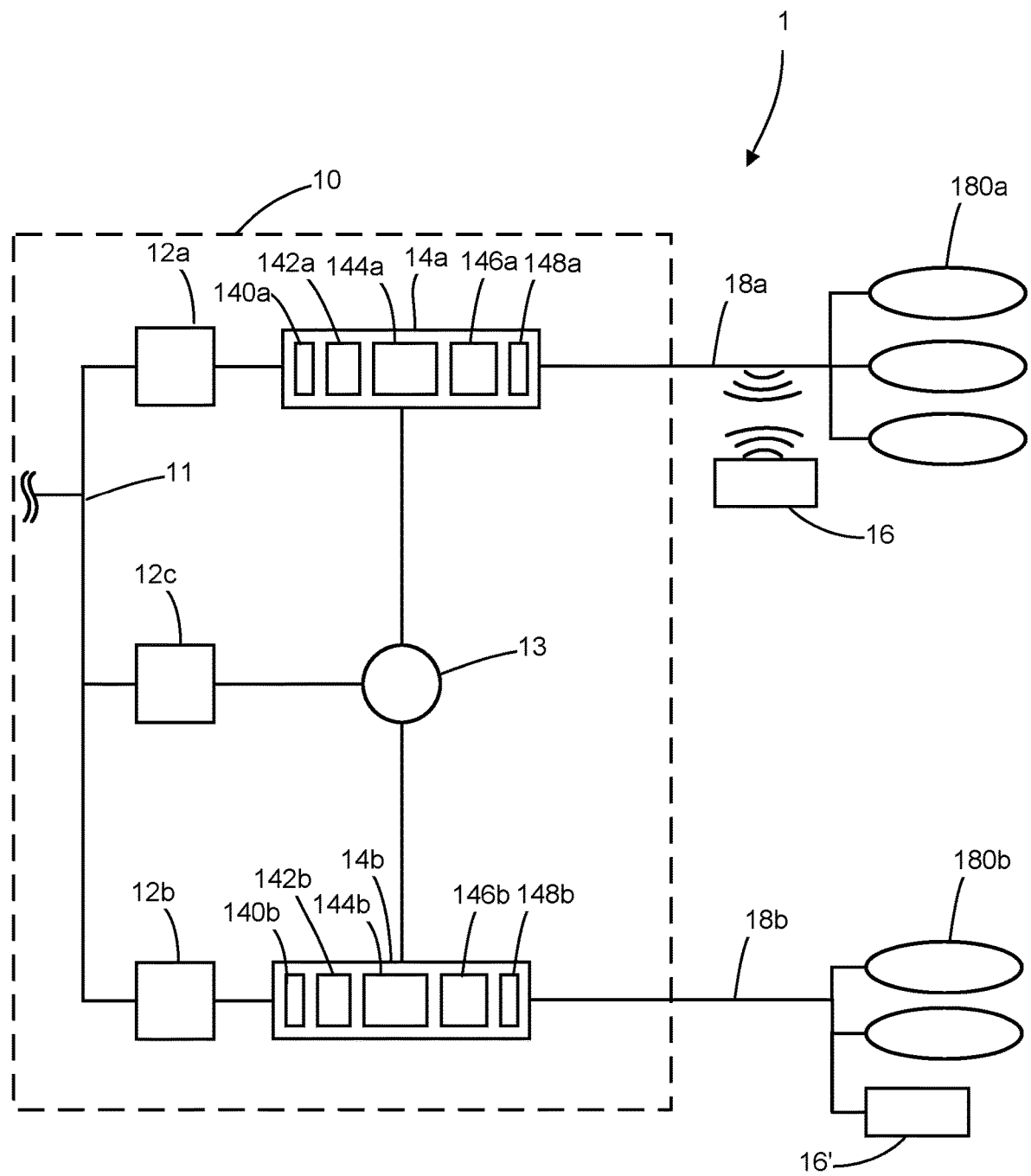
FIG. 1 shows a schematic drawing of a system for electronically marking a plurality of branch circuits of an electrical installation of an engineering structure according to an embodiment of the disclosure.

In the following description, reference is made to the accompanying figures, which show by way of illustration how the invention may be practiced. Similar reference numerals are used for similar elements across the various embodiments and figures described herein.

FIG. 1 shows a schematic drawing of a system 1 for electronically marking a plurality of branch circuits of an electrical installation of an engineering structure according to an embodiment of the disclosure.

The plurality of branch circuits comprises a first branch circuit 18a and a second branch circuit 18b. The system comprises: a first signalling device 14a and a second signalling device 14b. The first signalling device 14a comprises a first connection interface, the first connection interface being a first connection terminal 148a, and the second signalling device 14b comprises a second connection interface, the second connection interface being a second connection terminal 148b. The first connection terminal 148a is communicatively coupled to the first branch circuit 18a and the second connection terminal 148b is communicatively coupled to the second branch circuit 18b. The first signalling device 14a is configured to provide a first identification signal on the first branch circuit 18a and the second signalling device 14b is configured to provide a second identification signal on a second branch circuit 18b. The second identification signal is different from the first identification signal.

The first and second identification signals may be provided simultaneously or time-multiplexed.

A power supply signal is provided by a power supply wiring 11. The power supply signal is a 1-phase AC power supply signal of 230V and a frequency 50 Hz. The power supply signal may be a 3-phase AC power supply signal of 230V and a frequency 50 Hz. Alternatively, the power supply signal may be AC power supply signal of 110V and a frequency 60 Hz.

The first and second identification signals are signals of a frequency higher than the power supply signal provided by the power supply wiring 11.

The first and second identification signals are digital signals. The first and second identification signals have a voltage amplitude lower than the power supply signal of the power supply wiring 11. The first and second identification signals may have a voltage amplitude peak-peak of less than 20 V.

The first and second identification signals are signals representative of an identification mark. The identification signals and the identification marks are unique in the electrical installation.

The identification mark may be determined by a user by means of a signal receiving device 16, 16' (described below).

The first branch circuit 18a is a circuit of a first circuit breaker 12a. The first branch circuit 18a is the circuit supplied with a power supply signal, via the first circuit breaker 12a. The first branch circuit 18a comprises a first plurality of outlets 180a.

The second branch circuit 18b is a circuit of a second circuit breaker 12b. The second branch circuit 18b is the circuit, which is supplied with a power supply signal via the second circuit breaker 12b. The second branch circuit 18b comprises a second plurality of outlets 180b.

The first signalling device 14a is arranged in between the first circuit breaker 12a of the first branch circuit 18a and a wiring of the first branch circuit illustrated by the outlets 180a when seen along a signal path of the power supply signal. The second signalling device 14b is arranged in between the second circuit breaker 12b of the second branch circuit 18b and a wiring of the second branch circuit illustrated by the outlets 180b when seen along a signal path of the power supply signal.

The signalling devices 14a, 14b may be communicatively coupled to a respective circuit breaker, i.e. the first signalling device 14a is communicatively coupled to the first circuit breaker 12a and the second signalling device 14b is communicatively coupled to the second circuit breaker 12b. The signalling devices 14a, 14b are arranged in between the circuit breakers 12a, 12b and respective branch circuit 18a, 18b thereof, when seen along a signal path of a power supply signal, provided by the power supply wiring 11.

The one or more signalling devices 14a, 14b are installed in an electrical panel 10. The one or more signalling devices 14a, 14b are connected to an output terminal (not shown) of a respective circuit breaker 12a, 12b.

The first 14a and second signalling devices 14b each comprise a signal generator configured to generate the first and the second identification signal, respectively. The first 14a and second signalling devices 14b moreover each comprise a respective processing unit 146a, 146b, connected to and integrated with the respective signal generator configured to generate the first and/or second identification signal. In other embodiments, the respective signal generators are not formed integrally with the processing units 146a, 146b but connected to the processing units 146a, 146b.

The first 14a and second signalling devices 14b are connected to a power supply unit 13, providing a supply voltage to the signalling devices 14a, 14b. The power supply unit 13 is connected to a third circuit breaker 12c. The power supply unit 13 provides a low-voltage supply voltage to the signalling devices 14a, 14b. The low-voltage supply voltage has an amplitude of 12V DC.

In some embodiments, the first 14a and second signalling devices 14b each comprise a display unit 144a, 144b for displaying an identification mark of the first and the second branch circuit, respectively. The display units 144a, 144b indicate a branch circuit identification mark, which can be identified at an outlet 180a, 180b and/or apparatus of the respective branch circuit 18a, 18b.

Each of the first signalling device 14a and the second signalling device 14b comprises a respective input terminal 140a, 140b wherein the input terminal 140a of the first signal signalling device 14a is communicatively coupled to a first circuit breaker 12a. The input terminal 140b of the second signal signalling device 14b is communicatively coupled to the second circuit breaker 12b.

The input terminals 140a, 140b each comprise a connection point configured to be connected to a power supply signal, i.e. a hot wire. The power supply signal is provided from the power supply wiring 11 via the first 12a and second circuit breaker 12b, respectively.

The first 14a and the second signalling devices 14b each further comprise a filter 142a, 142b communicatively connected to the respective input terminal 140a, 140b, the filters 142a, 142b being configured to attenuate a frequency of the first and/or second identification signal. The respective filters 142a, 142b are provided between the respective input terminals 140a, 140b and the respective signal generator and processing unit 146a, 146b.

The filters 142a, 142b are thus configured to attenuate and prevent the first and the second identification signal from reaching the respective circuit breaker 12a, 12b.

The filters 142a, 142b are configured to attenuate the first and second identification signal, respectively by at least 80 dB. The filters 142a, 142b are low-pass filters with a cross-over frequency above a frequency of a $4^{th}$ harmonic of the power supply signal.

The first identification signal is provided on the first branch circuit 18a via the first connection terminal 148a and the second identification signal is provided on the second branch circuit 18b via the second connection terminal 148b.

The connection terminals 148a, 148b are electrically conducting interfaces facilitating electrical connection between the first 14a and second signalling device 14b and the wiring of the branch circuit(s) 18a, 18b.

Via the first signalling devices 14a, a power supply signal is routed on the first branch circuit 18a. Via the second signalling device 14b, a power supply signal is routed on the second branch circuit 18b.

The first 14a and second signalling devices 14b are configured to transmit the first and second identification signal, respectively, while the power supply signal is routed through the first 14a and second signalling devices 14b.

The system further comprises a signal receiving device 16 configured to receive an identification signal. The signal receiving device is configured to wirelessly receive the first identification signal from the first branch circuit 18a.

The system further comprises a signal receiving device 16' also configured to receive an identification signal. The signal receiving device is configured to receive the first identification signal from the second branch circuit 18a in a wired manner. The signal receiving device 16' is wired connected to the second branch circuit 180b.

Signal receiving devices 16 and 16' may be identical devices.

The signal receiving devices 16 and 16' are configured to identify a mark of the respective branch circuit 18a, 18b based on the first and second identification signal, respectively.

The first and second identification signal comprises a RFID signal. In other embodiments, the first and second identification signals may alternatively or additionally comprise another digital signal, such as a PWM signal.

In the system shown in FIG. 1, wiring of the first 18a and second branch circuit 18b is used as an antenna for the respective identification signals. The first and second identification signals each comprise an identification mark.

The first and/or second identification signals may be coded.

Figure 2:
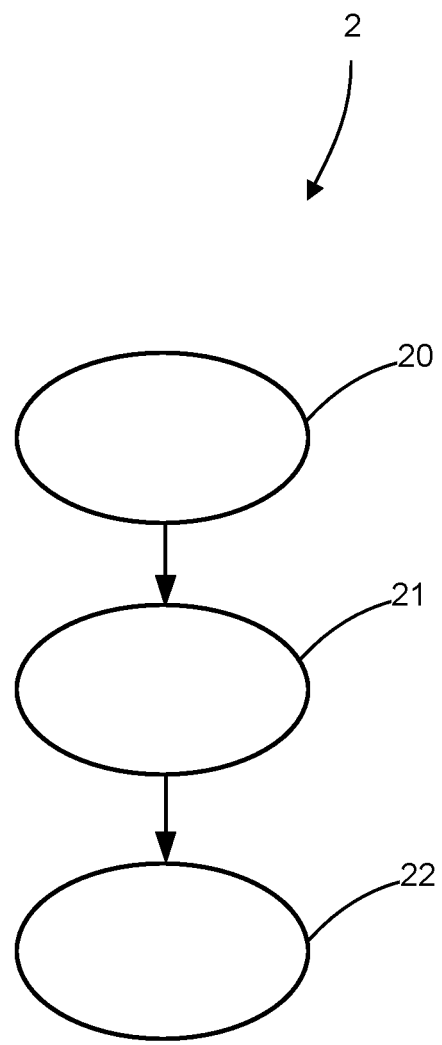
FIG. 2 shows a flow chart of a method of electronically marking a plurality of branch circuits of an electrical installation of an engineering structure according to an embodiment of the disclosure.

FIG. 2 shows a flow chart of a method 2 of electronically marking a plurality of branch circuits of an electrical installation of an engineering structure according to an embodiment of the present disclosure.

The method 2 comprises the step of providing 20 one or more signalling devices, wherein at least one of the signalling devices is communicatively coupled to the first branch circuit, and wherein at least one of the signalling devices is communicatively coupled to the second branch circuit.

The method 2 further comprises the step 21 of providing, by the at least one signalling device communicatively coupled to the first branch circuit, a first identification signal on the first branch circuit.

The method 2 further comprises the step of providing 22, by the at least one signalling device communicatively coupled to the second branch circuit, a second identification signal on the second branch circuit, wherein the second identification signal is different from the first identification signal.

The one or more signalling devices provided in step 20 is a first signalling device and a second signalling device. The first and second branch circuits as well as the identification signals may be branch circuits and identification signals as described with respect to the system 1 as shown in FIG. 1.

Although some embodiments have been described and shown in detail, the invention is not restricted to them, but may also be embodied in other ways within the scope of the subject matter defined in the following claims. In particular, it is to be understood that other embodiments may be utilised and structural and functional modifications may be made without departing from the scope of the invention.

In device claims enumerating several means, several of these means can be embodied by one and the same item of hardware. The mere fact that certain measures are recited in mutually different dependent claims or described in different embodiments does not indicate that a combination of these measures cannot be used to advantage.

It should be emphasized that the term "comprises/comprising" when used in this specification is taken to specify the presence of stated features, integers, steps or components but does not preclude the presence or addition of one or more other features, integers, steps, components or groups thereof.

The invention claimed is:

1. A method of electronically marking a plurality of branch circuits of an electrical installation of an engineering structure, the plurality of branch circuits comprising a first branch circuit and a second branch circuit, the method comprising:
   providing one or more signalling devices, wherein at least one of the signalling devices is communicatively coupled to the first branch circuit, and wherein at least one of the signalling devices is communicatively coupled to the second branch circuit;
   providing, by the at least one signalling device communicatively coupled to the first branch circuit, a first identification signal on the first branch circuit;
   providing, by the at least one signalling device communicatively coupled to the second branch circuit, a second identification signal on the second branch circuit,
   wherein the second identification signal is different from the first identification signal, and
   wherein the one or more signalling devices each comprises a filter configured to attenuate a frequency of the first and/or second identification signal;
   routing, via the one or more signalling devices, a power supply signal on the first branch circuit;
   routing, via the one or more signalling devices, a power supply signal on the second branch circuit,
   wherein the first and second identification signals are provided while the power supply signals are routed through the one or more signalling devices;
   receiving, by a signal receiving device, an identification signal, the identification signal being the first identification signal or the second identification signal,
   wherein the signal receiving device:
      is configured to receive the signal from the respective branch circuit wirelessly, or
      comprises a probe, which is wiredly connectable to a wire of the respective branch circuit, and is configured to receive the signal by a wired connection by means of the probe.

2. The method according to claim 1, wherein the one or more signalling devices comprise(s) a first connection interface communicatively coupled to the first branch circuit and a second connection interface communicatively coupled to the second branch circuit.

3. The method according to claim 2, further comprising:
   receiving, by a signal receiving device, an identification signal, the identification signal being the first identification signal or the second identification signal; and
   identifying, by the signal receiving device, a branch circuit based on the identification signal.

4. The method according to claim 3, wherein the one or more signalling devices comprise(s) a first signalling device and a second signalling device, wherein the first branch circuit is communicatively coupled to the first signalling device, and wherein the second branch circuit is communicatively coupled to the second signalling device;
   wherein the first identification signal is provided by the first signalling device, and wherein the second identification signal is provided by the second signalling device.

5. The method according to claim 1, further comprising:
   receiving, by a signal receiving device, an identification signal, the identification signal being the first identification signal or the second identification signal; and
   identifying, by the signal receiving device, a branch circuit based on the identification signal.

6. The method according to claim 1, wherein the one or more signalling devices comprise(s) a first signalling device and a second signalling device, wherein the first branch circuit is communicatively coupled to the first signalling device, and wherein the second branch circuit is communicatively coupled to the second signalling device;
   wherein the first identification signal is provided by the first signalling device, and wherein the second identification signal is provided by the second signalling device.

7. The method according to claim 6, wherein:
   each of the first signalling device and the second signalling device comprise an input terminal and a connection interface;
   the input terminal of the first signal signalling device is communicatively coupled to a first circuit breaker and the connection interface of the first signalling device is communicatively coupled to the first branch circuit; and
   the input terminal of the second signal signalling device is communicatively coupled to a second circuit breaker and the connection interface of the second signalling device is communicatively coupled to the second branch circuit.

8. The method according to claim 1, wherein the first identification signal comprises a pulse-width modulated (PWM) signal and/or a radio frequency identification (RFID) signal, and wherein the second identification signal comprises a PWM signal and/or a RFID signal.

9. A system for electronically marking a plurality of branch circuits of an electrical installation of an engineering structure, the plurality of branch circuits comprising a first branch circuit and a second branch circuit, wherein the system comprises:
   one or more signalling devices comprising a first connection interface and a second connection interface; and
   a signal receiving device configured to receive an identification signal, the identification signal being the first identification signal or the second identification signal;
   wherein:
      the first connection interface of the one or more signalling devices is communicatively couplable to the first branch circuit and the second connection interface is communicatively couplable to the second branch circuit;
      the one or more signalling devices is/are configured to provide a first identification signal on the first branch circuit and configured to provide a second identification signal on a second branch circuit;
      wherein the second identification signal is different from the first identification signal;

the one or more signalling devices further comprise(s) at least one input terminal for receiving a power supply signal and is/are further configured to route a power supply signal to the first branch circuit and to the second branch circuit;

the one or more signalling devices further comprise(s) a filter communicatively connected to the at least one input terminal, the filter being configured to attenuate a frequency of the first and/or second identification signal, and the one or more signalling devices is/are configured to transmit the first and/or second identification signal while the power supply signals are routed through the one or more signalling devices; and wherein the signal receiving device:
is configured to receive the signal from the respective branch circuit wirelessly, or
comprises a probe, which is wiredly connectable to a wire of the respective branch circuit, and is configured to receive the signal by a wired connection by means of the probe.

10. The system according to claim 9, wherein the signal receiving device is further configured to identify a branch circuit based on the identification signal.

11. The system according to claim 10, wherein the one or more signalling devices comprises a first signalling device and a second signalling device, wherein the first branch circuit is communicatively couplable to the first signalling device, and wherein the second branch circuit is communicatively couplable to the second signalling device.

12. The system according to claim 11, wherein the first signalling device comprises an input terminal configured to be connected to a first circuit breaker and an output interface configured to be connected to the first branch circuit; and
wherein the second signalling device comprises an input terminal configured to be connected to a second circuit breaker and an output interface configured to be connected to the second branch circuit.

13. The system according to claim 12, wherein the first identification signal comprises a pulse-width modulated (PWM) signal and/or a radio frequency identification (RFID) signal, and wherein the second identification signal comprises a PWM signal and/or a RFID signal.

14. The system according to claim 9, wherein the one or more signalling devices comprises a first signalling device and a second signalling device, wherein the first branch circuit is communicatively couplable to the first signalling device, and wherein the second branch circuit is communicatively couplable to the second signalling device.

15. The system according to claim 14, wherein the first signalling device comprises an input terminal configured to be connected to a first circuit breaker and an output interface configured to be connected to the first branch circuit; and
wherein the second signalling device comprises an input terminal configured to be connected to a second circuit breaker and an output interface configured to be connected to the second branch circuit.

16. The system according to claim 14, wherein the first identification signal comprises a pulse-width modulated (PWM) signal and/or a radio frequency identification (RFID) signal, and wherein the second identification signal comprises a PWM signal and/or a RFID signal.

17. The system according to claim 15, wherein the first identification signal comprises a pulse-width modulated (PWM) signal and/or a radio frequency identification (RFID) signal, and wherein the second identification signal comprises a PWM signal and/or a RFID signal.

18. The system according to claim 9, wherein the first identification signal comprises a pulse-width modulated (PWM) signal and/or a radio frequency identification (RFID) signal, and wherein the second identification signal comprises a PWM signal and/or a RFID signal.

19. The system according to claim 10, wherein the first identification signal comprises a pulse-width modulated (PWM) signal and/or a radio frequency identification (RFID) signal, and wherein the second identification signal comprises a PWM signal and/or a RFID signal.

20. The system according to claim 11, wherein the first identification signal comprises a pulse-width modulated (PWM) signal and/or a radio frequency identification (RFID) signal, and wherein the second identification signal comprises a PWM signal and/or a RFID signal.

* * * * *